(12) United States Patent
Yuan et al.

(10) Patent No.: US 7,126,858 B1
(45) Date of Patent: Oct. 24, 2006

(54) APPARATUS FOR EMULATING ASYNCHRONOUS CLEAR IN MEMORY STRUCTURE AND METHOD FOR IMPLEMENTING THE SAME

(75) Inventors: Jinyong Yuan, Cupertino, CA (US); Peter Kazarian, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/156,083

(22) Filed: Jun. 17, 2005

(51) Int. Cl.
*G11C 7/10* (2006.01)
(52) U.S. Cl. .................................. 365/189.02; 365/154
(58) Field of Classification Search ........... 365/189.02, 365/240, 154, 230.02
See application file for complete search history.

(56) References Cited

U.S. PATENT DOCUMENTS 5,038,059 A * 8/1991 Ebzery et al. ............... 327/217
5,493,242 A * 2/1996 Simmons et al. ............. 327/12
6,091,645 A * 7/2000 Iadanza .................. 365/189.02
6,529,040 B1 * 3/2003 Carberry et al. .............. 326/40
6,765,408 B1 * 7/2004 Cheng et al. .................. 326/41

* cited by examiner

*Primary Examiner*—Anh Phung
(74) *Attorney, Agent, or Firm*—Martine Penilla & Gencarella, LLP

(57) ABSTRACT

Circuitry is disclosed for emulating asynchronous clear on each of a read address register of a memory cell and a data output register of a memory cell such that the memory cell can be defined in a memory structure that does not support asynchronous clear capability. The emulation includes defining the memory cell to have a registered read address input and a data output connected to an input of a multiplexer. The register connected to the read address input of the multiplexer does not include an asynchronous clear connection. The data transmitted from the memory cell to the multiplexer is output from the multiplexer when an asynchronous clear signal has not been asserted. However, the multiplexer is further connected to output either null data or a ground signal in lieu of the data transmitted from the memory cell when an asynchronous clear signal has been asserted.

20 Claims, 4 Drawing Sheets

APPARATUS FOR EMULATING ASYNCHRONOUS CLEAR IN MEMORY STRUCTURE AND METHOD FOR IMPLEMENTING THE SAME

BACKGROUND

Memory structures in modern integrated circuit designs may include an asynchronous clear capability to enable clearing of data within the memory structure without coordination with a clock signal used to drive the integrated circuit. However, situations can arise in which the asynchronous clear capability is not supported by either a stock memory architecture or logic synthesis software used to design the integrated circuit. For example, a field programmable gate array (FPGA) can be defined to include separate memory and logic structures, wherein the memory structure is defined to support efficient implementation of memory components. Additionally, the aforementioned FPGA may not be capable of supporting an asynchronous clear function in the memory structure.

In designing the aforementioned FPGA, the memory components associated with the asynchronous clear functionality could be defined from scratch in the logic structure of the FPGA. However, defining asynchronous memory components in the logic structure of the FPGA consumes a large amount of the available logic structure and can lead to adverse FPGA performance issues. Furthermore, when using design software to design the FPGA, extremely long design compilation times can result from explicitly defining a large number of memory components that support asynchronous clear function in the logic structure of the FPGA. Additionally, the design software may simply not be able to handle the explicit definition of a large number of asynchronous memory components in the logic structure of the FPGA.

In view of the foregoing, a solution is needed for defining asynchronous memory components in a FPGA without having to define the asynchronous memory components explicitly outside of a memory structure provided by the FPGA.

SUMMARY

In one embodiment, a method is disclosed for emulating asynchronous clear on a read address register of a memory cell. The method includes connecting a first register to a read address input of a first memory cell. It should be appreciated that the first register does not include an asynchronous clear connection. The method also includes connecting a data output of the first memory cell to a first input of a multiplexer. The method further includes connecting a read address input of a second memory cell to a ground signal. A data output of the second memory cell is connected to a second input of the multiplexer. Additionally, the method includes generating a select signal and using the select signal to control the multiplexer, wherein the select signal is generated to have a state opposite that of an asynchronous clear signal. A non-asserted state of the select signal causes the multiplexer to output data received at the second input of the multiplexer from the data output of the second memory cell. An asserted state of the select signal causes the multiplexer to output data received at the first input of the multiplexer from the data output of the first memory cell. Thus, when the asynchronous clear signal is not asserted, the select signal will be asserted and the multiplexer will output data provided by the first memory cell, wherein the first memory cell has a registered read address input. However, when the asynchronous clear signal is asserted, the select signal will not be asserted and the multiplexer will output null data provided by the second memory cell which has its read address input connected to ground.

In another embodiment, a method is disclosed for emulating asynchronous clear on a data output register of a memory cell. The method includes connecting a register to a read address input of a memory cell. It should be appreciated that the register does not include an asynchronous clear connection. The method also includes connecting a data output of the memory cell to a first input of a multiplexer. The method further includes connecting a ground signal to a second input of the multiplexer. Additionally, the method includes generating a select signal and using the select signal to control the multiplexer, wherein the select signal is generated to have a state opposite that of an asynchronous clear signal. A non-asserted state of the select signal causes the multiplexer to output the ground signal received at the second input of the multiplexer. An asserted state of the select signal causes the multiplexer to output data received at the first input of the multiplexer from the data output of the memory cell. Thus, when the asynchronous clear signal is not asserted, the select signal will be asserted and the multiplexer will output data from the memory cell. Because the memory cell has a registered read address input, the data output from the memory cell effectively represents the data that would be output by a register connected to the data output of the memory cell. When the asynchronous clear signal is asserted, the select signal will not be asserted and the multiplexer will output the ground signal.

It should be appreciated that each of the methods discussed above can be embodied as program instructions on a computer readable media. In one embodiment, the program instructions representing the operations for the respective methods can define a portion of a logic synthesis software program, wherein the logic synthesis software program is capable of defining circuitry within a programmable chip such as a field programmable gate array (FPGA).

In another embodiment, a circuit is disclosed for emulating asynchronous clear on a read address register of a memory cell. The circuit includes a first memory cell having a read address input and a data output. The circuit also includes a first register having a data output connected to the read address input of the first memory cell. It should be appreciated that the first register is not connected to receive an asynchronous clear signal. The circuit further includes a second memory cell having a read address input and a data output, wherein the read address input is connected to receive a ground signal. The circuit also includes a multiplexer having first and second data inputs, a data output, and a select signal input. The first data input of the multiplexer is connected to receive data from the data output of the first memory cell. The second data input of the multiplexer is connected to receive data from the data output of the second memory cell. The select signal input of the multiplexer is connected to receive a select signal that has a state opposite that of an asynchronous clear signal. The multiplexer is configured to transmit data received at the first data input of the multiplexer to the data output of the multiplexer when the select signal has an asserted state. The multiplexer is further configured to transmit data received at the second data input of the multiplexer to the data output of the multiplexer when the select signal has a non-asserted state. Thus, when the asynchronous clear signal is not asserted and the select signal is asserted, the multiplexer outputs data provided by the first memory cell, wherein the first memory cell has a registered read address input. However, when the asynchronous clear signal is asserted and the select signal is not asserted, the multiplexer outputs null data provided by the second memory cell which has its read address input connected to ground.

In another embodiment, a circuit is disclosed for emulating asynchronous clear on a data output register of a memory cell. The circuit includes a memory cell having a read address input and a data output. The circuit also includes a register having a data output connected to the read address input of the memory cell. It should be appreciated that the register is not connected to receive an asynchronous clear signal. The circuit further includes a multiplexer having first and second data inputs, a data output, and a select signal input. The first data input of the multiplexer is connected to receive data from the data output of the memory cell. The second data input of the multiplexer is connected to receive a ground signal. The select signal input of the multiplexer is connected to receive a select signal that has a state opposite that of an asynchronous clear signal. The multiplexer is configured to transmit data received at the first data input of the multiplexer to the data output of the multiplexer when the select signal has an asserted state. The multiplexer is further configured to transmit data received at the second data input of the multiplexer to the data output of the multiplexer when the select signal has a non-asserted state. Thus, when the asynchronous clear signal is not asserted, the select signal will be asserted and the multiplexer will output data from the memory cell. Because the memory cell has a registered read address input, the data output from the memory cell effectively represents the data that would be output by a register connected to the data output of the memory cell. When the asynchronous clear signal is asserted, the select signal will not be asserted and the multiplexer will output the ground signal.

In each of the circuits discussed above, an asynchronous clear enabled register can be implemented to generate the select signal. The asynchronous clear enabled register includes a data input connected to a supply voltage and a data output connected to provide the select signal to the select signal input of the multiplexer. Additionally, the asynchronous clear enabled register includes an asynchronous clear input. If an asserted asynchronous clear signal is received at the asynchronous clear input, the select signal will be generated as a ground signal in accordance with a subsequent clock cycle. However, if a non-asserted asynchronous clear signal is received at the asynchronous clear input, the select signal will be generated to correspond to the supply voltage in accordance with a subsequent clock cycle.

Further with respect to each of the circuits discussed above, the multiplexer and an associated select signal generation component, e.g., the asynchronous clear enabled register, can be implemented in a logic structure of a FPGA, wherein a memory structure of the FPGA does not support an asynchronous clear function. It should be appreciated that in the FPGA, the logic structure and the memory structure are separate entities having respective specifications and capabilities.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
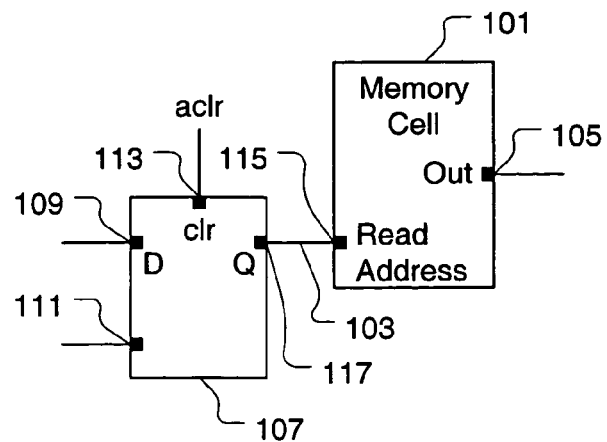
FIG. 1 is an illustration showing a memory cell having an asynchronous clear capability on a read address register.

FIG. 1 is an illustration showing a memory cell 101 having an asynchronous clear capability on a read address register 107. The memory cell 101 includes a read address input 115 and a data output 105. The read address input 115 is connected to a data output 117 of the read address register 107, through a connection 103. The read address register 107 includes a data input 109, a clock input 111, and an asynchronous clear input 113. It should be appreciated that data received at the data input 109 is stored in the read address register 107 in accordance with a clock signal received at the clock input 111. Also, data stored in the read address register 107 is transmitted through the data output 117 in accordance with the clock signal received at the clock input 111.

It should be appreciated that the asynchronous clear input 113 can receive an asserted asynchronous clear input signal at any time and independently from receipt of the clock signal at the clock input 111. When the asynchronous clear input 113 receives an asserted asynchronous clear input signal, the data stored in the read address register 107 will be cleared. Thus, the data transmitted through the data output 117 in accordance with a subsequent clock signal will represent the cleared state of the read address register 107. If an asserted asynchronous clear input signal has not been received at the asynchronous clear input 113, the previous data received through the data input 109 and stored in the read address register 107 will be transmitted through the data output 117 in accordance with a subsequent clock signal.

In certain situations, asynchronous clear capability such as that described above with respect to the asynchronous clear input 113 cannot be implemented directly in a read address register of a memory cell. For example, in one embodiment a field programmable gate array (FPGA) includes separate memory and logic structures. The memory structure of the FPGA may support or require use of read address register in conjunction with a memory cell, wherein both the read address register and the memory cell are defined in the memory structure of the FPGA. However, if the memory structure of the FPGA does not support an asynchronous clear capability on the read address register of the memory cell, the present invention as discussed with respect to FIG. 2 can be used to emulate the asynchronous clear capability on the read address register of the memory cell.

Figure 2:
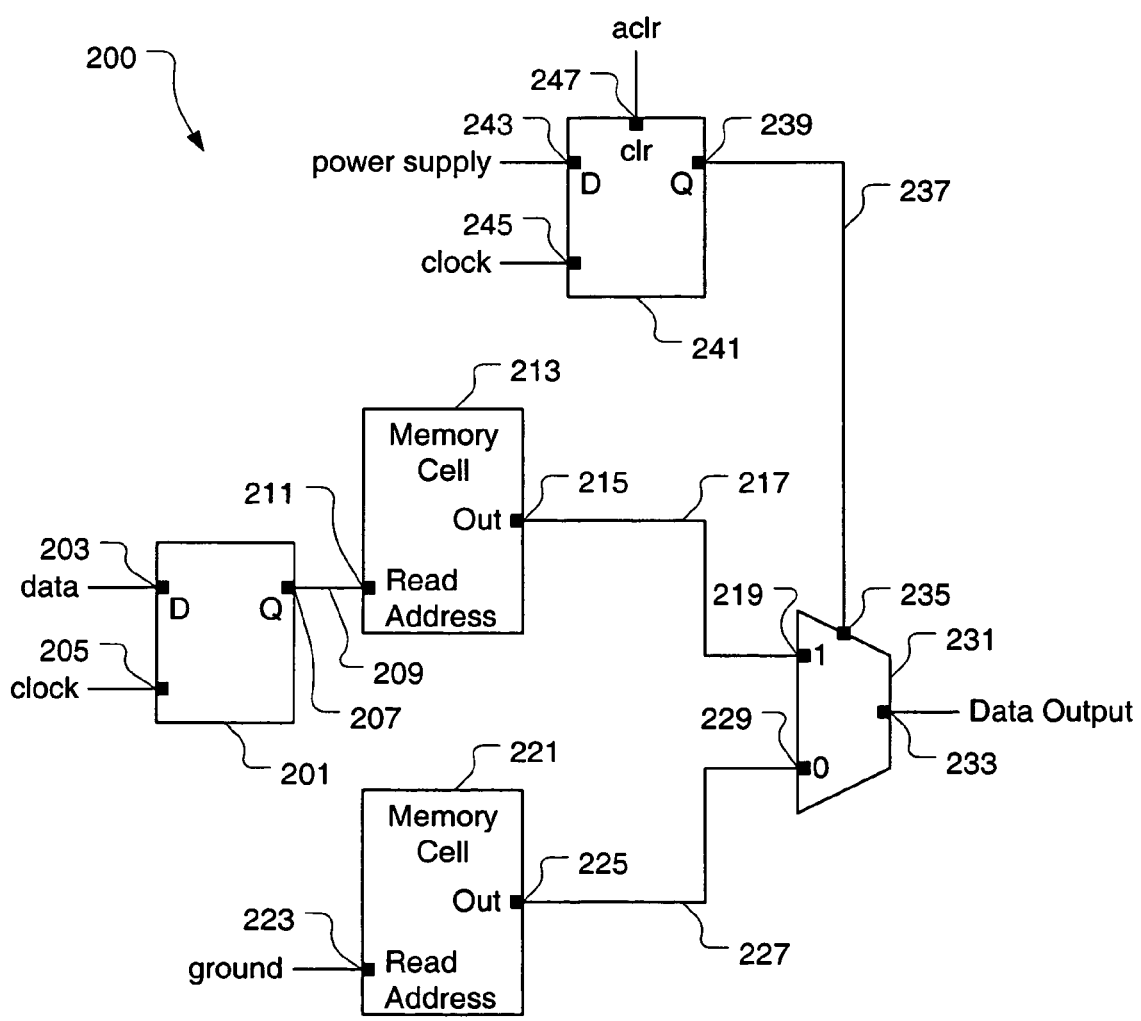
FIG. 2 is an illustration showing a circuit for emulating an asynchronous clear capability on a read address register of a memory cell, in accordance with one embodiment of the present invention.

FIG. 2 is an illustration showing a circuit 200 for emulating an asynchronous clear capability on a read address register of a memory cell, in accordance with one embodiment of the present invention. The circuit 200 includes a first memory cell 213 having a read address input 211 and a data output 215. The circuit 200 further includes a first register 201 including a data output 207 connected to the read address input 211 of the first memory cell 213, as indicated by connection 209. The first register 201 also includes a data input 203 and a clock input 205. It should be appreciated that the first register 201 is not connected to receive an asynchronous clear signal or implement an asynchronous clear capability.

The circuit 200 further includes a second memory cell 221 having a read address input 223 and a data output 225. The read address input 223 of the second memory cell 221 is connected to receive a ground signal. Additionally, the circuit 200 includes a multiplexer 231 having a first data input 219, a second data input 229, a data output 233, and a select signal input 235. The first data input 219 of the multiplexer 231 is connected to receive data from the data output 215 of the first memory cell 213, as indicated by connection 217. The second data input 229 of the multiplexer 231 is connected to receive data from the data output 225 of the second memory cell 221, as indicated by connection 227. The select signal input 235 of the multiplexer 231 is connected to receive a select signal from a data output 239 of a select register 241, as indicated by connection 237. The multiplexer 231 is configured to transmit data received at the first data input 219 of the multiplexer 231 to the data output 233 of the multiplexer 231 when the select signal has an asserted state, e.g., "1." The multiplexer 231 is further configured to transmit data received at the second data input 229 of the multiplexer 231 to the data output 233 of the multiplexer 231 when the select signal has a non-asserted state, e.g., "0." In one embodiment, the asserted state is represented by a higher voltage signal, i.e., "high signal", that exceeds an assertion threshold voltage, and a non-asserted state is represented by a lower voltage signal, i.e., "low signal", that does not exceed the assertion threshold voltage.

The select register 241 is defined as an asynchronous clear enabled register. In addition to the data output 239, the select register 241 includes a data input 243, a clock input 245, and a clear input 247. The data input 243 is connected to receive a power supply voltage. It should be appreciated that the power supply voltage corresponds to a high signal representing an asserted signal state. The clear input 247 is connected to receive an asynchronous clear signal ("aclr"). It should be appreciated that the asynchronous clear signal can be received at any time and independently from receipt of the clock signal at the clock input 245. When an asserted asynchronous clear signal is received at the clear input 247, the data presently stored in the select register 241 is cleared such that an equivalent of a ground state signal is stored in the select register 241. Following receipt of the asserted asynchronous clear signal at the clear input 247, the select register 241 is defined to provide a ground signal at the data output 239 in accordance with a subsequent clock signal received at the clock input 245. If an asserted asynchronous clear signal has not been received, however, the select register 241 is defined to provide a signal corresponding to the supply voltage at the data output 239 in accordance with a subsequent clock signal received at the clock input 245. Thus, the select signal provided at the data output 239 will have the opposite state of the asynchronous clear signal received at the clear input 247.

In accordance with the above description of circuit 200, when the asynchronous clear signal is not asserted and the select signal is asserted, the multiplexer 231 functions to output data provided by the first memory cell 213, wherein the first memory cell 213 has a registered read address input 211. However, when the asynchronous clear signal is asserted and the select signal is not asserted, the multiplexer 231 functions to output null data provided by the second memory cell 221 which has its read address input 223 connected to ground. Hence, the circuit 200 serves as an emulation of the a memory cell having an asynchronous clear capability on a read address register. Furthermore, it should be appreciated that the register 201 and the select register 241 can be defined to receive and transmit data in accordance with a common clock signal received at their respective clock inputs 205 and 245.

In one embodiment, the circuit 200 can be used to emulate asynchronous clear capability on a read address register of a memory cell in a FPGA that does not support asynchronous clear capability within a memory structure defined thereon. In this embodiment, the multiplexer 231, the asynchronous clear enabled register 241, and the memory cell 221 can be implemented in logic structures of the FPGA that are separate from the memory structure. Additionally, in this embodiment, the register 201 and the memory cell 213 can be implemented within the memory structure of the FPGA, thus utilizing the efficiencies provided by defining memory cells within the designated memory structure of the FPGA.

Figure 3:
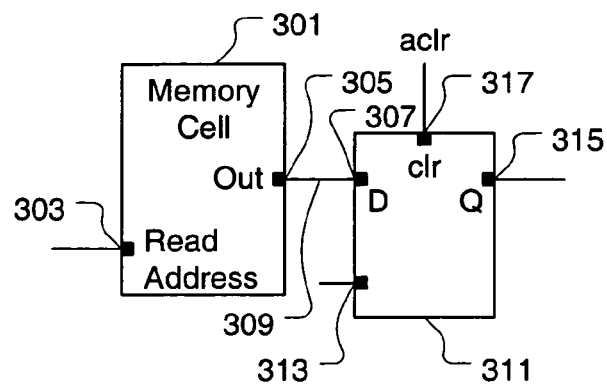
FIG. 3 is an illustration showing a memory cell having an asynchronous clear capability on a data output register.

FIG. 3 is an illustration showing a memory cell 301 having an asynchronous clear capability on a data output register 311. The memory cell 301 includes a read address input 303 and a data output 305. The data output 305 is connected to a data input 307 of the data output register 311, through a connection 309. The data output register 311 also includes a data output 315, a clock input 313, and an asynchronous clear input 317. It should be appreciated that data received at the data input 307 is stored in the data output register 311 in accordance with a clock signal received at the clock input 313. Also, data stored in the data output register 311 is transmitted through the data output 315 in accordance with the clock signal received at the clock input 313.

It should be appreciated that the asynchronous clear input 317 can receive an asserted asynchronous clear input signal at any time and independently from receipt of the clock signal at the clock input 313. When the asynchronous clear input 317 receives an asserted asynchronous clear input signal, the data stored in the data output register 311 will be cleared. Thus, the data transmitted through the data output 315 in accordance with a subsequent clock signal will represent the cleared state of the data output register 311. If an asserted asynchronous clear input signal has not been received at the asynchronous clear input 317, the previous data received through the data input 307 and stored in the data output register 311 will be transmitted through the data output 315 in accordance with a subsequent clock signal received at the clock input 313.

In certain situations, asynchronous clear capability such as that described above with respect to the asynchronous clear input 317 cannot be implemented directly in a data output register of a memory cell. As previously discussed, an exemplary embodiment exists in which a FPGA includes separate memory and logic structures. The memory structure of the FPGA may support or require use of a data output register in conjunction with a memory cell, wherein both the data output register and the memory cell are defined in the memory structure of the FPGA. However, if the memory structure of the FPGA does not support an asynchronous clear capability on the data output register of the memory cell, the present invention as discussed with respect to FIG. 4 can be used to emulate the asynchronous clear capability on the data output register of the memory cell.

Figure 4:
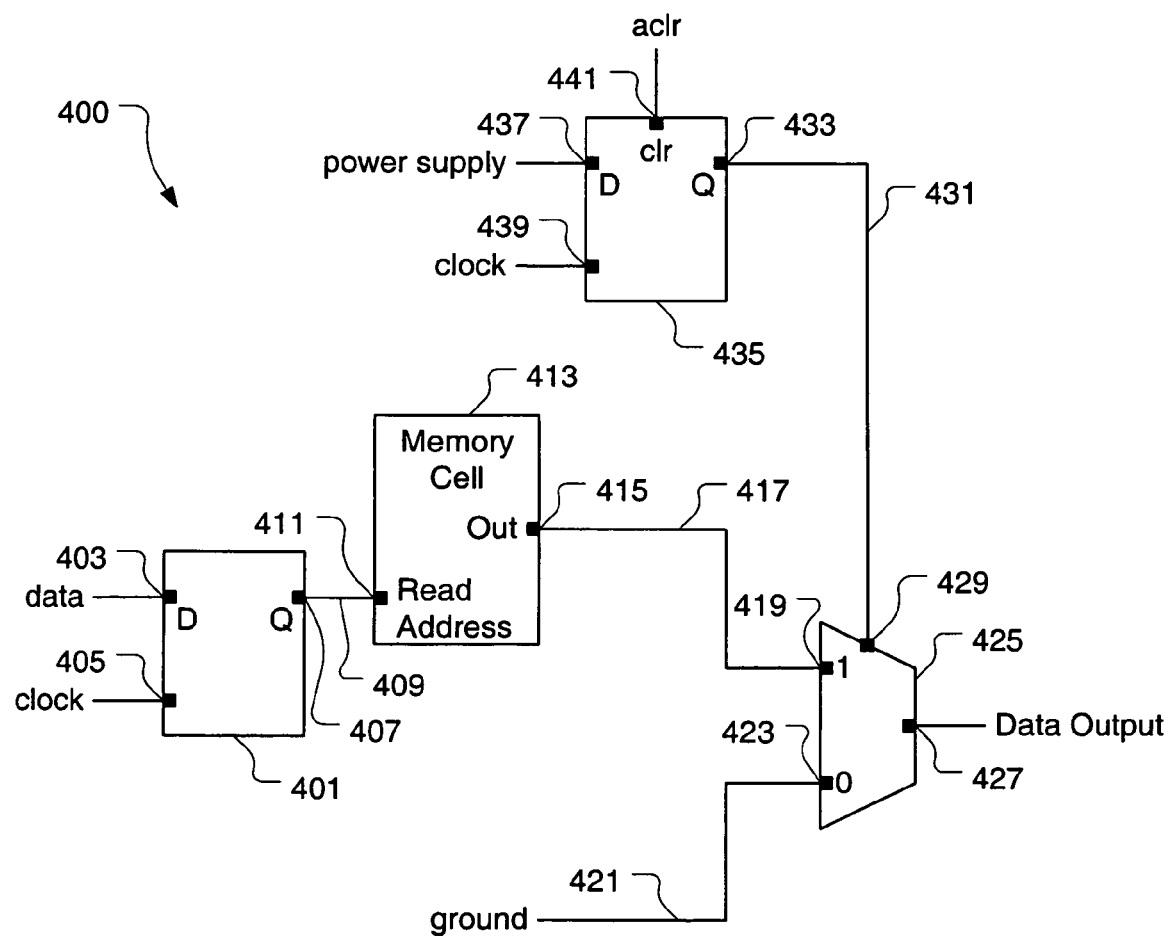
FIG. 4 is an illustration showing a circuit for emulating an asynchronous clear capability on a data output register of a memory cell, in accordance with one embodiment of the present invention.

FIG. 4 is an illustration showing a circuit 400 for emulating an asynchronous clear capability on a data output register of a memory cell, in accordance with one embodiment of the present invention. The circuit 400 includes a memory cell 413 having a read address input 411 and a data output 415. The circuit 400 further includes a register 401 including a data output 407 connected to the read address input 411 of the memory cell 413, as indicated by connection 409. The register 401 also includes a data input 403 and a clock input 405. It should be appreciated that the register 401 is not connected to receive an asynchronous clear signal or implement an asynchronous clear capability.

The circuit 400 further includes a multiplexer 425 having a first data input 419, a second data input 423, a data output 427, and a select signal input 429. The first data input 419 of the multiplexer 425 is connected to receive data from the data output 415 of the memory cell 413, as indicated by connection 417. The second data input 423 of the multiplexer 425 is connected to receive a ground signal, as indicated by connection 421. The select signal input 429 of the multiplexer 425 is connected to receive a select signal from a data output 433 of a select register 435, as indicated by connection 431. The multiplexer 425 is configured to transmit data received at the first data input 419 of the multiplexer 425 to the data output 427 of the multiplexer 425 when the select signal has an asserted state, e.g., "1." The multiplexer 425 is further configured to transmit the ground signal received at the second data input 423 of the multiplexer 425 to the data output 427 of the multiplexer 425 when the select signal has a non-asserted state, e.g., "0." In one embodiment, the asserted state is represented by a higher voltage signal, i.e., "high signal", that exceeds an assertion threshold voltage, and a non-asserted state is represented by a lower voltage signal, i.e., "low signal", that does not exceed the assertion threshold voltage.

The select register 435 is defined as an asynchronous clear enabled register. In addition to the data output 433, the select register 435 includes a data input 437, a clock input 439, and a clear input 441. The data input 437 is connected to receive a power supply voltage. It should be appreciated that the power supply voltage corresponds to a high signal representing an asserted signal state. The clear input 441 is connected to receive an asynchronous clear signal ("aclr"). It should be appreciated that the asynchronous clear signal can be received at any time and independently from receipt of the clock signal at the clock input 439. When an asserted asynchronous clear signal is received at the clear input 441, the data presently stored in the select register 435 is cleared such that an equivalent of a ground state signal is stored in the select register 435. Following receipt of the asserted asynchronous clear signal at the clear input 441, the select register 435 is defined to provide a ground signal at the data output 433 in accordance with a subsequent clock signal received at the clock input 439. If an asserted asynchronous clear signal has not been received, however, the select register 435 is defined to provide a signal corresponding to the supply voltage at the data output 433 in accordance with a subsequent clock signal received at the clock input 439. Thus, the select signal provided at the data output 433 will have the opposite state of the asynchronous clear signal received at the clear input 441.

In accordance with the above description of circuit 400, when the asynchronous clear signal is not asserted and the select signal is asserted, the multiplexer 425 functions to output data provided by the memory cell 413, wherein the memory cell 413 has a registered read address input 411. However, when the asynchronous clear signal is asserted and the select signal is not asserted, the multiplexer 425 functions to output the ground signal received through the second input 423 of the multiplexer 425. It should be appreciated that the register 401 and the select register 435 can be defined to receive and transmit data in accordance with a common clock signal received at their respective clock inputs 405 and 439.

When operating in a normal mode, i.e., with a non-asserted asynchronous clear signal, the circuit 400 effectively represents a push-back of the data output register of the memory cell onto the read address input of the memory cell. Because the memory cell 413 has a registered read address input 411, the data transmitted directly from the memory cell through the data output 415 effectively represents the data that would be transmitted from the data output register 311 of FIG. 3. When the asynchronous clear signal is asserted at the clear input 441 of the select register 435, the multiplexer 425 functions to replace the data transmitted from the memory cell 413 by the ground signal. Hence, the circuit 400 serves as an emulation of the a memory cell having an asynchronous clear capability on a data output register.

In one embodiment, the circuit 400 can be used to emulate asynchronous clear capability on a data output register of a memory cell in a FPGA that does not support asynchronous clear capability within a memory structure defined thereon. In this embodiment, the multiplexer 425 and the asynchronous clear enabled register 435 can be implemented in logic structures of the FPGA that are separate from the memory structure. Additionally, in this embodiment, the register 401 and the memory cell 413 can be implemented within the memory structure of the FPGA, thus utilizing the efficiencies provided by defining memory cells within the designated memory structure of the FPGA.

It should be further appreciated that in one embodiment the circuit 400 of FIG. 4 can also be used to solve the problem when the read address register (either asynchronous cleared or not) is needed but not present. Additionally, in another embodiment, the circuit 400 of FIG. 4 can also be used to solve the problem when the read address register is present, but for some reason (such as performance) the existing read address register is better implemented in the logic structures of the FPGA outside the memory structure of the FPGA. In the embodiments above, the data output register needs to be pushed back onto the read address input of the memory cell, thus it is necessary to consider whether the data output is registered and whether the data output register uses asynchronous clear.

Figure 5:
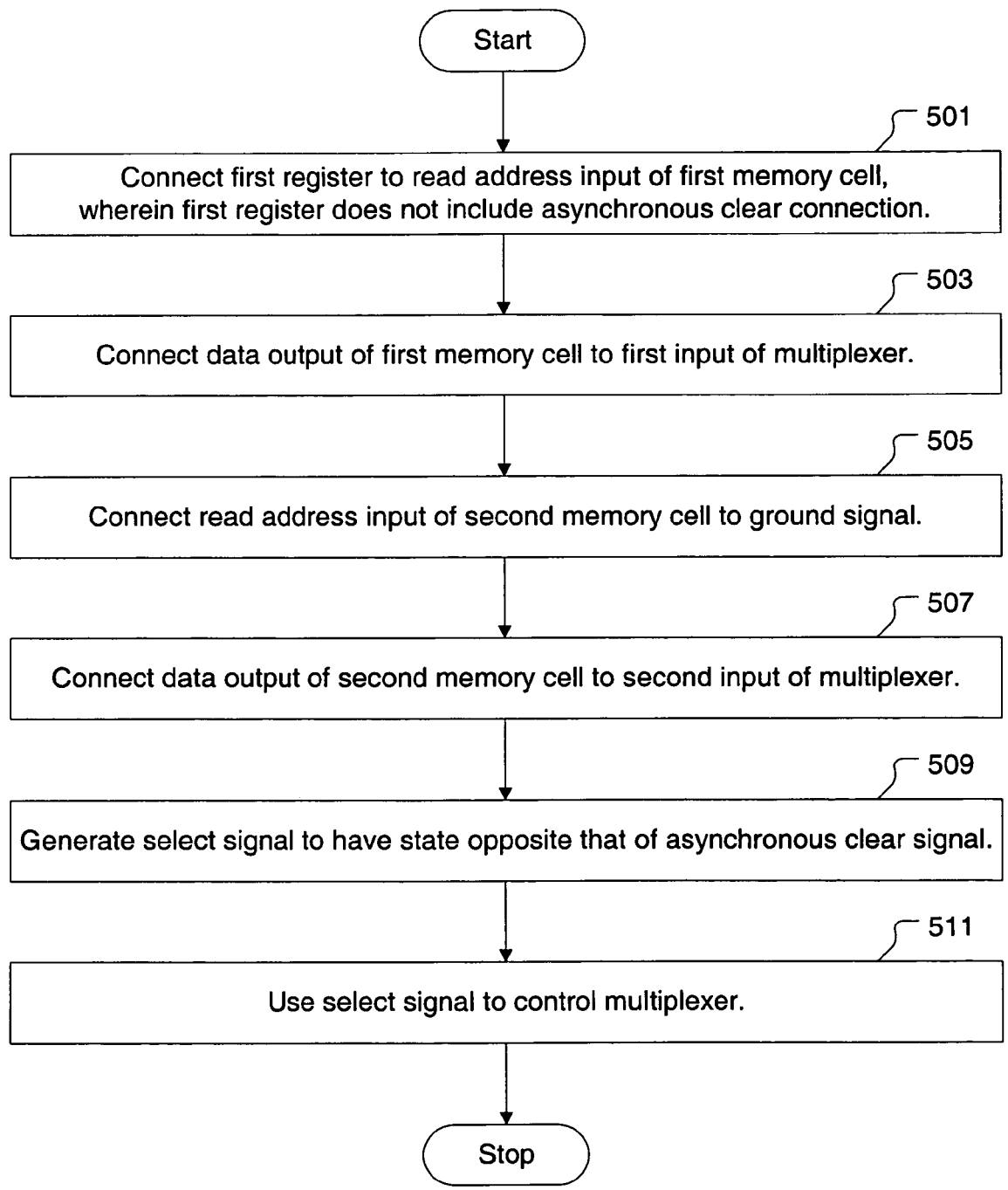
FIG. 5 is an illustration showing a flowchart of a method for emulating asynchronous clear on a read address register of a memory cell, in accordance with one embodiment of the present invention.

FIG. 5 is an illustration showing a flowchart of a method for emulating asynchronous clear on a read address register of a memory cell, in accordance with one embodiment of the present invention. The method includes an operation 501 for connecting a first register to a read address input of a first memory cell. It should be appreciated that the first register does not include an asynchronous clear connection. The method also includes an operation 503 for connecting a data output of the first memory cell to a first input of a multiplexer. In an operation 505, a read address input of a second memory cell is connected to a ground signal. An operation 507 is performed to connect a data output of the second memory cell to a second input of the multiplexer.

The method further includes an operation 509 for generating a select signal to have a state opposite that of an asynchronous clear signal. The operation 509 includes connecting a data input of an asynchronous clear enabled register to a supply voltage. The data output of the asynchronous clear enabled register is used as the select signal. In one embodiment, an asserted state of the asynchronous clear signal causes the asynchronous clear enabled register to provide a ground signal at the data output of the asynchronous clear enabled register. Additionally, a non-asserted state of the asynchronous clear signal causes the asynchronous clear enabled register to provide a signal corresponding to the supply voltage at the data output of the asynchronous clear enabled register.

The method also includes an operation 511 for using the select signal to control the multiplexer. In one embodiment, a non-asserted state of the select signal causes the multiplexer to output data received at the second input of the multiplexer from the data output of the second memory cell. Additionally, an asserted state of the select signal causes the multiplexer to output data received at the first input of the multiplexer from the data output of the first memory cell. It should be appreciated that each of the method operations 501–511 can be embodied as program instructions on a computer readable media. In one embodiment, the program instructions representing the method operations 501–511 define a portion of a logic synthesis software program, wherein the logic synthesis software program is capable of defining circuitry within a programmable chip such as a FPGA.

Figure 6:
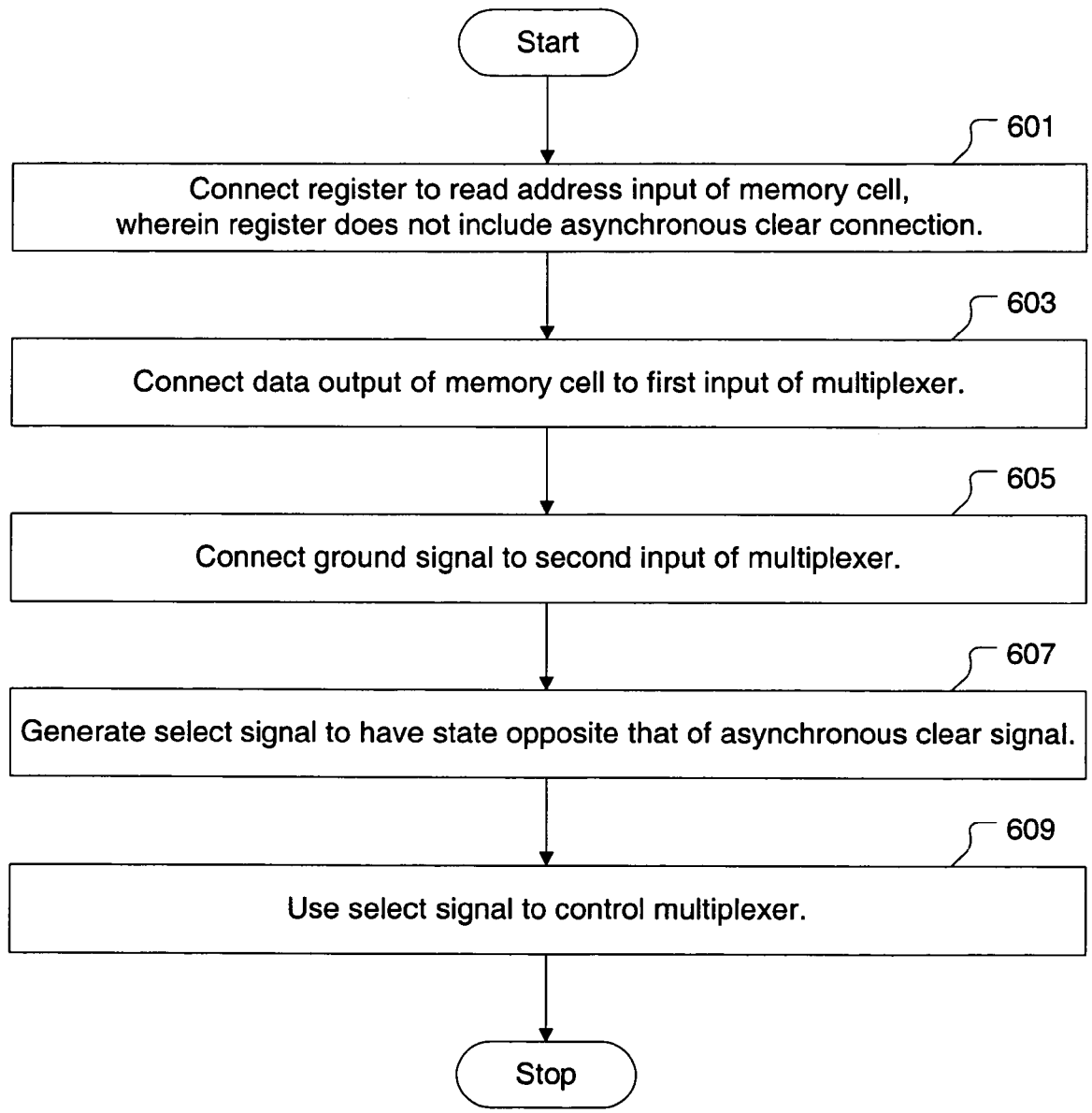
FIG. 6 is an illustration showing a flowchart of a method for emulating asynchronous clear on a data output register of a memory cell, in accordance with one embodiment of the present invention.

FIG. 6 is an illustration showing a flowchart of a method for emulating asynchronous clear on a data output register of a memory cell, in accordance with one embodiment of the present invention. The method includes an operation 601 for connecting a register to a read address input of a memory cell. It should be appreciated that the register does not include an asynchronous clear connection. The method also includes an operation 603 for connecting a data output of the memory cell to a first input of a multiplexer. In an operation 605, a ground signal is connected to a second input of the multiplexer.

The method further includes an operation 607 for generating a select signal to have a state opposite that of an asynchronous clear signal. The operation 607 includes connecting a data input of an asynchronous clear enabled register to a supply voltage. The data output of the asynchronous clear enabled register is used as the select signal. In one embodiment, an asserted state of the asynchronous clear signal causes the asynchronous clear enabled register to provide a ground signal at the data output of the asynchronous clear enabled register. Additionally, a non-asserted state of the asynchronous clear signal causes the asynchronous clear enabled register to provide a signal corresponding to the supply voltage at the data output of the asynchronous clear enabled register.

The method also includes an operation 609 for using the select signal to control the multiplexer. In one embodiment, a non-asserted state of the select signal causes the multiplexer to output the ground signal received at the second input of the multiplexer. Additionally, an asserted state of the select signal causes the multiplexer to output data received at the first input of the multiplexer from the data output of the memory cell. It should be appreciated that each of the method operations 601–609 can be embodied as program instructions on a computer readable media. In one embodiment, the program instructions representing the method operations 601–609 define a portion of a logic synthesis software program, wherein the logic synthesis software program is capable of defining circuitry within a programmable chip such as a FPGA.

It should be appreciated by those skilled in the art that design and implementation of complex modern integrated circuits are often performed using logic synthesis software. The logic synthesis software may support use of a textual hardware description language (HDL) or other interface to enable a user to define circuitry by indicating a required functionality of the circuitry with respect to electrical signal generation and propagation. For example, Verilog is a popular HDL that provides a standard digital simulation language for describing circuits at different levels of abstraction. Logic synthesis software is often used to take a user's design input, optimize the design input, and implement the design input using the resources on the FPGA. As previously discussed, the FPGA may include designated memory and logic structures, wherein the memory structure is defined to efficiently implement memory components that would otherwise be difficult to implement from scratch in the logic structure of the FPGA. However, the FPGA may not support an asynchronous clear capability in the designated memory structure of the FPGA. Additionally, the logic synthesis software may not support definition of an asynchronous clear capability within the designated memory structure of the FPGA.

In the case wherein either the FPGA or the logic synthesis software does not support an asynchronous clear capability within the designated memory structure of the FPGA, the present invention can be used to emulate the asynchronous clear functionality associated with a registered memory cell without requiring the memory cell to be defined outside of the memory structure of the FPGA. More specifically, the circuit 200 of FIG. 2 and the method of FIG. 5 can be used to emulate asynchronous clear on a read address register of a memory cell without requiring the memory cell to be defined outside of the memory structure of the FPGA. Additionally, the circuit 400 of FIG. 4 and the method of FIG. 6 can be used to emulate asynchronous clear on a data output register of a memory cell without requiring the memory cell to be defined outside of the memory structure of the FPGA.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A method for emulating asynchronous clear on a read address register of a memory cell, comprising:
   connecting a first register to a read address input of a first memory cell, wherein the first register does not include an asynchronous clear connection;
   connecting a data output of the first memory cell to a first input of a multiplexer;
   connecting a read address input of a second memory cell to a ground signal;
   connecting a data output of the second memory cell to a second input of the multiplexer;

generating a select signal to have a state opposite that of an asynchronous clear signal; and using the select signal to control the multiplexer, wherein a non-asserted state of the select signal causes the multiplexer to output data received at the second input of the multiplexer from the data output of the second memory cell, wherein an asserted state of the select signal causes the multiplexer to output data received at the first input of the multiplexer from the data output of the first memory cell.

2. A method as recited in claim 1, wherein generating the select signal includes connecting a data input of an asynchronous clear enabled register to a supply voltage and using the data output of the asynchronous clear enabled register as the select signal.

3. A method as recited in claim 2, wherein an asserted state of the asynchronous clear signal causes the asynchronous clear enabled register to provide a ground signal at the data output of the asynchronous clear enabled register, wherein a non-asserted state of the asynchronous clear signal causes the asynchronous clear enabled register to provide a signal corresponding to the supply voltage at the data output of the asynchronous clear enabled register.

4. A method as recited in claim 1, wherein the operations of connecting the first register to the read address input of the first memory cell, connecting the data output of the first memory cell to the first input of the multiplexer, connecting the read address input of the second memory cell to the ground signal, connecting the data output of the second memory cell to the second input of the multiplexer, generating the select signal to have the state opposite that of the asynchronous clear signal, and using the select signal to control the multiplexer, are each embodied as program instructions on a computer readable media.

5. A method as recited in claim 4, wherein the program instructions define a portion of a logic synthesis software program.

6. A method for emulating asynchronous clear on a data output register of a memory cell, comprising:

connecting a register to a read address input of a memory cell, wherein the register does not include an asynchronous clear connection;

connecting a data output of the memory cell to a first input of a multiplexer;

connecting a ground signal to a second input of the multiplexer;

generating a select signal to have a state opposite that of an asynchronous clear signal; and using the select signal to control the multiplexer, wherein a non-asserted state of the select signal causes the multiplexer to output the ground signal received at the second input of the multiplexer, wherein an asserted state of the select signal causes the multiplexer to output data received at the first input of the multiplexer from the data output of the memory cell.

7. A method as recited in claim 6, wherein generating the select signal includes connecting a data input of an asynchronous clear enabled register to a supply voltage and using the data output of the asynchronous clear enabled register as the select signal.

8. A method as recited in claim 7, wherein an asserted state of the asynchronous clear signal causes the asynchronous clear enabled register to provide a ground signal at the data output of the asynchronous clear enabled register, wherein a non-asserted state of the asynchronous clear signal causes the asynchronous clear enabled register to provide a signal corresponding to the supply voltage at the data output of the asynchronous clear enabled register.

9. A method as recited in claim 6, wherein the operations of connecting the register to the read address input of the memory cell, connecting the data output of the memory cell to the first input of a multiplexer, connecting the ground signal to the second input of the multiplexer, generating the select signal to have the state opposite that of the asynchronous clear signal, and using the select signal to control the multiplexer, are each embodied as program instructions on a computer readable media.

10. A method as recited in claim 9, wherein the program instructions define a portion of a logic synthesis software program.

11. A circuit for emulating asynchronous clear on a read address register of a memory cell, comprising:

a first memory cell having a read address input and a data output;

a first register having a data output connected to the read address input of the first memory cell, wherein the first register is not connected to receive an asynchronous clear signal;

a second memory cell having a read address input and a data output, wherein the read address input is connected to receive a ground signal; and a multiplexer having a first data input connected to receive data from the data output of the first memory cell, the multiplexer having a second data input connected to receive data from the data output of the second memory cell, the multiplexer having a select signal input connected to receive a select signal having a state opposite that of an asynchronous clear signal, the multiplexer being configured to transmit data received at the first data input of the multiplexer to a data output of the multiplexer when the select signal has an asserted state, the multiplexer being configured to transmit data received at the second data input of the multiplexer to the data output of the multiplexer when the select signal has a non-asserted state.

12. A circuit as recited in claim 11, further comprising:

an asynchronous clear enabled register having a data input connected to a supply voltage and a data output connected to provide the select signal to the select signal input of the multiplexer, the asynchronous clear enabled register including an asynchronous clear input.

13. A circuit as recited in claim 12, wherein the asynchronous clear enabled register is defined to provide a ground signal at the data output of the asynchronous clear enabled register when an asserted asynchronous clear signal is present at the asynchronous clear input, wherein the asynchronous clear enabled register is defined to provide a signal corresponding to the supply voltage at the data output of the asynchronous clear enabled register when a non-asserted asynchronous clear signal is present at the asynchronous clear input.

14. A circuit as recited in claim 12, wherein the multiplexer and the asynchronous clear enabled register are implemented in logic structures of a field programmable gate array chip, wherein the logic structures are separate from a memory structure of the field programmable gate array chip.

15. A circuit as recited in claim 14, wherein the memory structure of the field programmable gate array chip does not support an asynchronous clear function.

16. A circuit for emulating asynchronous clear on a data output register of a memory cell, comprising:

a memory cell having a read address input and a data output;

a register having a data output connected to the read address input of the memory cell, wherein the register is not connected to receive an asynchronous clear signal; and a multiplexer having a first data input connected to receive data from the data output of the memory cell, the multiplexer having a second data input connected to receive a ground signal, the multiplexer having a select signal input connected to receive a select signal having a state opposite that of an asynchronous clear signal, the multiplexer being configured to transmit data received at the first data input of the multiplexer to a data output of the multiplexer when the select signal has an asserted state, the multiplexer being configured to transmit data received at the second data input of the multiplexer to the data output of the multiplexer when the select signal has a non-asserted state.

17. A circuit as recited in claim 16, further comprising:

an asynchronous clear enabled register having a data input connected to a supply voltage and a data output connected to provide the select signal to the select signal input of the multiplexer, the asynchronous clear enabled register including an asynchronous clear input.

18. A circuit as recited in claim 17, wherein the asynchronous clear enabled register is defined to provide a ground signal at the data output of the asynchronous clear enabled register when an asserted asynchronous clear signal is present at the asynchronous clear input, wherein the asynchronous clear enabled register is defined to provide a signal corresponding to the supply voltage at the data output of the asynchronous clear enabled register when a non-asserted asynchronous clear signal is present at the asynchronous clear input.

19. A circuit as recited in claim 17, wherein the multiplexer and the asynchronous clear enabled register are implemented in logic structures of a field programmable gate array chip, wherein the logic structures are separate from a memory structure of the field programmable gate array chip.

20. A circuit as recited in claim 19, wherein the memory structure of the field programmable gate array chip does not support an asynchronous clear function.

* * * * *